United States Patent
Takasawa et al.

(10) Patent No.: US 8,218,122 B2
(45) Date of Patent: Jul. 10, 2012

(54) METHOD FOR FORMING WIRING FILM, TRANSISTOR AND ELECTRONIC DEVICE

(75) Inventors: Satoru Takasawa, Sammu (JP); Masaki Takei, Sammu (JP); Hirohisa Takahashi, Sammu (JP); Hiroaki Katagiri, Sammu (JP); Sadayuki Ukishima, Sammu (JP); Noriaki Tani, Sammu (JP); Satoru Ishibashi, Sammu (JP); Tadashi Masuda, Tomisato (JP)

(73) Assignee: Ulvac, Inc., Chigasaki-shi (JP)

( * ) Notice: Subject to any disclaimer, the term of this patent is extended or adjusted under 35 U.S.C. 154(b) by 433 days.

(21) Appl. No.: 12/475,907

(22) Filed: Jun. 1, 2009

(65) Prior Publication Data

US 2009/0303406 A1    Dec. 10, 2009

Related U.S. Application Data

(63) Continuation of application No. PCT/JP2007/074931, filed on Dec. 26, 2007.

(30) Foreign Application Priority Data

Dec. 28, 2006  (JP) .................................. 2006-354859
Dec. 28, 2006  (JP) .................................. 2006-354860

(51) Int. Cl.
*G02F 1/13*  (2006.01)

(52) U.S. Cl. ........................................ 349/187; 349/139

(58) Field of Classification Search .................. 349/187, 349/139, 39; 216/13; 257/288, E29.255
See application file for complete search history.

(56) References Cited

U.S. PATENT DOCUMENTS

| | | | | |
|---|---|---|---|---|
| 4,354,911 A | * | 10/1982 | Dodd et al. | 204/192.3 |
| 6,037,257 A | * | 3/2000 | Chiang et al. | 438/687 |
| 2006/0102907 A1 | | 5/2006 | Lee et al. | 257/72 |

FOREIGN PATENT DOCUMENTS

| | | |
|---|---|---|
| CN | 1183570 A | 6/1998 |
| JP | 6-333925 | 12/1994 |
| JP | 10-12151 | 1/1998 |
| JP | 11-54458 | 2/1999 |
| JP | 2002-091338 | 3/2002 |
| JP | 2002-91338 A1 | 3/2002 |
| JP | 2005-158887 A1 | 6/2005 |
| JP | 2006-148040 A1 | 6/2006 |

OTHER PUBLICATIONS

Chinese Office Action No. 200780040402.2 dated Jul. 2, 2010 with English translation.
International Search Report for International Application No. PCT/JP2007/074931 dated Mar. 31, 2008.

* cited by examiner

*Primary Examiner* — Thoi Duong
(74) *Attorney, Agent, or Firm* — Kratz, Quintos & Hanson, LLP (57) ABSTRACT

A wiring film having excellent adhesion and barrier property and a low resistance value is formed. An oxygen gas is introduced into a vacuum chamber in which an object to be film formed is disposed; a sputtering target is sputtered in a vacuum ambience containing oxygen; and a first metallic film is formed on a surface of the object to be film formed. The first sputtering target includes copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy. Thereafter, a second metallic film is formed on a surface of the first metallic film by sputtering the sputtering target in a state in which the introduction of the oxygen gas into a vacuum ambience is stopped, and then a wiring film is formed by etching the first and second metallic films.

14 Claims, 5 Drawing Sheets

METHOD FOR FORMING WIRING FILM, TRANSISTOR AND ELECTRONIC DEVICE

The present invention is a Continuation of International Application No. PCT/JP2007/074931 filed Dec. 26, 2007, which claims priority to Japan Patent Document No. 2006-354859, filed on Dec. 28, 2006 and Japan Patent Document No. 2006-354860, filed on Dec. 28, 2006. The entire disclosures of the prior applications are hereby incorporated by reference herein in their entireties.

BACKGROUND

The present invention generally relates to a wiring film; and more particularly, the invention relates to a wiring film for transistors and a method for forming such a wiring film.

Heretofore, low-resistance materials (such as, Al, Cu, etc.) have been used in metallic wiring films for electric parts. For instance, in the case of the TFT (Thin film transistor) liquid crystal displays, a demand for the reduction in the resistance of the wiring electrodes has been increasing with the enlargement of the panels, and the necessity for using Al and Cu as the low-resistance wirings has been growing.

When an Al wiring including Al as a major component is in contact with an oxide (such as, $SiO_2$, ITO (indium tin oxide) or the like), hillock may be formed by oxygen of the oxide. Furthermore, when the Al wiring is used as source and drain electrodes of a TFT, there are problems of diffusion into an underlying Si layer and a degradation in contact resistance between a transparent electrode made of ITO.

On the other hand, as to the Cu wiring, Cu is a material having a lower resistance than that of Al. Although degradation in the contact resistance between Al and the ITO transparent electrode poses a problem, copper oxide exhibits an excellent contact resistance because it has less insulating than aluminum oxide.

Therefore, a need to use Cu for low-resistance wiring films has been increasing. However, as compared to other wiring materials, there are problems in that Cu has poor adhesion to underlying materials (such as glass, Si or the like) and in that Cu diffuses into the Si layer when it is used as the source and drain electrodes. Thus, a barrier layer is required at an interface between the Cu wiring and other layers so as to enhance the adhesion and prevent the diffusion. With regard to an underlying Cu seed layer made of a Cu plating, which is used for a semiconductor, a barrier layer made of TiN, TaN or the like is required to prevent the diffusion from the view point of the same diffusion problem as mentioned above.

As to related patents on metallic wiring films including Cu as a major component for electronic parts, a technique characterized by adding an element (such as, Mo or the like) into Cu (JP-A 2005-158887) and a technique characterized by introducing nitrogen or oxygen during a film forming method by sputtering pure Cu (JP-A 10-12151) are known. However, both of the above-mentioned conventional techniques have problems in adhesion, reduction of resistance, and formation of hillock.

The present invention has been accomplished in order to solve the above-mentioned problems; and the object of the present invention is to provide a low-resistance wiring film having high adhesion to the glass substrate and the silicon layer.

SUMMARY OF THE INVENTION

The present inventors discovered that a metallic film (alloy film) formed by using a target (including Cu as a major component and at least one kind of additive elements selected from the group consisting of Mg, Al, Si, IIa group elements (Be, Ca, Sr, Ba and Ra), and IIIb group elements (rare earth Sc, Y, lanthanoid group La, Ce, Pr, Nd, Pm, Sm, Eu, Gd, Tb and Dy)), and by introducing an oxygen gas while sputtering is performed, not only has high adhesion to silicon and glass but also an excellent barrier property in order to prevent the diffusion of the metal(s) into silicon.

Figure 7:
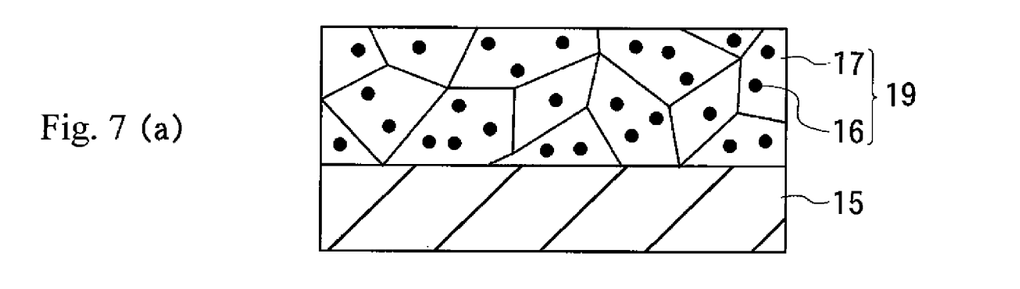
FIG. 7(a) is a sectional view for schematically illustrating a metallic film including Cu as a major component, and Mg.
FIG. 7(b) is a sectional view for schematically illustrating a metallic film including Cu as a major component, Mg and oxygen.

FIGS. 7(a) and (b) show conditions in which metal films 14, 19 are formed on surfaces of substrates 15 by sputtering a target including Cu as a major component and containing the above additive element(s). In FIG. 7(a), a reference numeral 19 shows the metallic film containing no oxygen formed by sputtering without the introduction of oxygen, and a reference numeral 14 of FIG. 7(b) shows the metallic film containing oxygen formed by sputtering with the introduction of oxygen.

Inside the oxygen-free metallic film 19, additive element particle 16 containing the additive element are dispersed in copper crystals 17, and copper crystals 17 are exposed to top and rear surfaces of the oxygen-free metallic film 19, so that the substrate 15 is in direct contact with the copper crystals 17. Therefore, adhesion between the oxygen-free metallic film 19 and the substrate 15 is low; and if the substrate 15 is a silicon substrate, copper diffuses.

Atomic radii of Mg, Al, Si, Be, Ca, Sr, Ba, Ra, Sc, Y, La, Ce, Pr, Nd, Pm, Sm, Eu, Gd, Tb and Dy are smaller than the atomic radius of Cu and they are readily precipitatable by the addition of oxygen. Thus, in the oxygen-containing metallic film 14, the above additive element and an oxide thereof are precipitated outside the copper crystals 17 at the time of the film formation; and oxide film 18 containing the additive element and an oxide thereof is formed at interfaces of the copper crystals 17. Because the substrate 15 is in contact with the oxide film 18 but is not directly in contact with the copper crystals 17 being crystals of pure copper, the oxygen-containing metallic film 14 has higher adhesion to the substrate 15 as compared to the oxygen-free metallic film 19, and copper does not diffuse into the substrate 15.

As mentioned above, the oxygen-containing metallic film 14 containing both oxygen and the above additive element (s) has excellent adhesion and barrier property, but it has a higher electric resistance and thus, poor electric characteristics for the wiring film as compared to the oxygen-free metallic film 19.

The present inventors found that a wiring film having excellent adhesion and barrier property and excellent electric characteristics is obtained by forming the metallic film containing both oxygen and the additive element(s) on the surface of the substrate 15 and thereafter laminating a metallic film having a lower electric resistance on the surface of the metallic film. Consequently, the inventors accomplished the present invention.

The present invention, which has been accomplished based on the above knowledge, is directed to a wiring film forming method for forming a wiring film on a surface of an object to be film formed of which silicon or silicon dioxide is exposed. The wiring film forming method includes the steps of introducing an oxide gas and a sputtering gas into a vacuum ambience in which the object to be film formed is disposed, sputtering a first sputtering target in the vacuum ambience containing oxygen, wherein the first sputtering target includes copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy, forming a first metallic film on a surface of the object to be film formed, thereafter sputtering a second target including copper as a major component in the state that the object to be film formed is disposed in a vacuum ambience and the introduction of the oxygen gas is stopped, forming a second metallic film on a surface of the first metallic film, etching the first and second metallic films, and thereby forming the wiring film.

The present invention is directed to the wiring film forming method, wherein an identical target is used as the first and second sputtering targets, and the formation of the first metallic film and the formation of the second metallic film are performed inside the same vacuum chamber.

The present invention is directed to the wiring film forming method, wherein as the second sputtering target, a target is used including copper as a major component and least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy. The first and second sputtering targets are arranged inside separate vacuum chambers; and the formations of the first and second metallic films are performed in the separate vacuum chambers.

The present invention is directed to the wiring film forming method, wherein a pure copper target is used as the second sputtering target, the first and second sputtering targets are arranged inside the same vacuum chamber, and the formation of the first metallic film and that of the second metallic film are performed in the above vacuum chamber.

The present invention is directed to the wiring film forming method, wherein a pure copper target is used as the second sputtering target, the first and second sputtering targets are arranged inside separate vacuum chambers, and the formations of the first and second metallic films are performed inside the separate vacuum chambers.

The present invention is directed to a wiring film forming method, wherein after the second metallic film is formed, the oxygen gas and the sputtering gas are introduced into the vacuum ambience in which the object to be film formed is disposed; a third sputtering target is sputtered in the oxygen-containing vacuum ambience; the third sputtering target includes copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy; a third metallic film is formed on a surface of the second metallic film; and thereafter the first to third metallic films are etched.

The present invention is directed to the wiring film forming method, wherein as the second target, a target is used containing at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy.

The present invention is directed to the wiring film forming method, wherein the first to third sputtering targets are arranged in separate vacuum chambers; and the formations of the first to third metallic films are formed in the separate vacuum chambers.

The present invention is directed to the wiring film forming method, wherein the first and third sputtering targets are arranged in the same vacuum chamber, the formations of the first and third metallic films are performed in the same vacuum chamber, the second sputtering target is arranged in a vacuum chamber different from that for the first and third sputtering targets, and the second metallic film is formed inside the different vacuum chamber.

The present invention is directed to the wiring film forming method, wherein a pure copper target is used as the second sputtering target.

The present invention is directed to the wiring film forming method, wherein the first to third sputtering targets are arranged inside separate vacuum chambers, and the first to third metallic films are formed inside the separate vacuum chamber.

The present invention is directed to the wiring film forming method, wherein the first and third sputtering targets are arranged inside the same vacuum chamber; the first and third metallic films are formed in the same vacuum chamber; the second sputtering target is arranged inside a vacuum chamber different from that for the first and third sputtering target; and the second metallic film is formed in the different vacuum chamber.

The present invention is directed to the wiring film forming method, wherein a target containing at least 0.1 atomic % and at most 10.0 atomic % of Al is used as the first sputtering target. The oxygen gas is introduced such that a ratio of the partial pressure of the oxygen gas to the partial pressure of the sputtering gas in the vacuum ambience is at least 0.1% and at most 20.0%; and the first sputtering target is sputtered.

The present invention is directed to the wiring film forming method, wherein a target containing at least 0.1 atomic % and at most 10.0 atomic % of Mg is used as the first sputtering target, the oxygen gas is introduced such that a ratio of the partial pressure of the oxygen gas to the partial pressure of the sputtering gas in the vacuum ambience is at least 0.1% and at most 20.0%, and the first sputtering target is sputtered.

The present invention is directed to a transistor including a gate electrode, a drain semiconductor layer made of a semiconductor, and a source semiconductor layer made of a semiconductor, wherein the application of a voltage to the gate electrode makes electrical connection or disconnection between the drain semiconductor layer and the source semiconductor layer, wherein a first metallic film is formed on either one or both of a surface of the drain semiconductor layer and a surface of the source semiconductor layer. The first metallic film includes copper as a major component and contains oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy; and a second metallic film including copper as a major component and having a resistance lower than the resistance of the first metallic film is formed on a surface of the first metallic film.

The present invention is directed to the transistor, wherein at least 0.1 atomic % of oxygen is contained in the first metallic film.

The present invention is directed to the transistor, wherein a third metallic film is formed on a surface of the second metallic film, the third metallic film including copper as a major component, oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy.

The present invention is directed to a transistor including a gate electrode, a drain semiconductor layer made of a semiconductor, and a source semiconductor electrode made of a semiconductor, applying a voltage to the gate electrode makes electrical connection or disconnection between the drain semiconductor layer and the source semiconductor layer, and the gate electrode contacting a glass substrate. The gate electrode includes a first metallic film formed on a surface of the glass substrate and a second metallic film formed on a surface of the first metallic film. The first metallic film includes copper as a major component, oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy; and the second metallic film includes copper as a major component and has a resistance lower than the resistance of the first metallic film.

The present invention is directed to the transistor, wherein the first metallic film contains at least 0.1 atomic % of oxygen.

The present invention is directed to the transistor, wherein a third metallic film is formed on a surface of a second metallic film, the third metallic film including copper as a major component, oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy.

The present invention is directed to an electronic device having a transistor, the transistor including a gate electrode, a drain semiconductor layer made of a semiconductor, and a source semiconductor electrode made of a semiconductor, applying a voltage to the gate electrode makes electrical connection or disconnection between the drain semiconductor layer and the source semiconductor layer; and the gate electrode is in contact with a glass substrate, wherein a first metallic film is formed on either one or both of a surface of the drain semiconductor layer and a surface of the source semiconductor layer, the first metallic film includes copper as a major component, oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy; and a second metallic film including copper as a major component and having a resistance lower than the resistance of the first metallic film is formed on a surface of the first metallic film.

The present invention is directed to the electronic device, wherein the first metallic film contains at least 0.1 atomic % of oxygen.

The present invention is directed to an electronic device having a transistor, the transistor including a gate electrode, a drain semiconductor layer made of a semiconductor and a source semiconductor layer made of a semiconductor, applying a voltage to the gate electrode makes electrical connection or disconnection between the drain semiconductor layer and the source semiconductor layer; and the gate electrode is in contact with a glass substrate, wherein the gate electrode includes a first metallic film formed on a surface of the glass substrate and a second metallic film formed on a surface of the first metallic film. The first metallic film includes copper as a major component, oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy; and the second metallic film includes copper as a major component and has a resistance lower than the resistance of the first metallic film.

The present invention is directed to the electronic device, wherein the first metallic film contains at least 0.1 atomic % of oxygen.

The present invention is directed to an electronic device including a glass substrate, a transparent pixel electrode arranged on the glass substrate, liquid crystals arranged on the pixel electrode, a transparent common electrode arranged on the liquid crystals, and a storage electrode tightly adhered to the glass substrate, wherein a storage capacity having the storage electrode as a one-side electrode is connected to a liquid crystal capacity formed between the pixel electrode and the storage electrode, and the orientation of the liquid crystals is controlled by charging and discharging the liquid crystal capacity. The storage electrode includes a first metallic film formed on a surface of the glass substrate and a second metallic film formed on a surface of the first metallic film. The first metallic film includes copper as a major component, oxygen and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy; and the second metallic film includes copper as a major component and has a resistance lower than the resistance of the first metallic film.

The present invention is directed to the electronic device, wherein the first metallic film contains at least 0.1 atomic % of oxygen.

The major component in the present invention means that the element as the major component is contained by at least 50 atomic %. Therefore, "copper as a major component" means "copper atoms are contained at least 50 atomic %".

Although an element(s) (for example, Mn) other than Cu and the above-mentioned elements may be mixed as an impurity in the target used in the present invention. The content of the impurity element(s) is less than 0.1 atomic %, and ordinarily less than $10^{-4}$ atomic %. In the wiring film of the present invention formed by using such a target, the content of the impurity element(s) other than Cu, the additive elements and oxygen is less than 0.1 atomic %, and ordinarily less than $10^{-4}$ atomic %.

In addition, "pure copper" in the present invention means pure copper in which the content of the impurity element(s) other than Cu is less than 0.1 atomic %, and ordinarily less than $10^{-4}$ atomic %.

The ratio of content between copper and the additive element(s) in the sputtering target is the same as the ratio of content between copper and the additive element(s) of the metallic film formed by using this sputtering target both when the film is formed in the vacuum ambience into which only the sputtering gas is introduced and when the film is formed in the vacuum ambience into which both the oxygen gas and the sputtering gas are introduced. Further, the content ratio does not change even if the introduced amount of the oxygen gas is varied.

Therefore, when the sputtering target in which the ratio of the additive element(s) to the total amount of copper and the additive element (s) is at least 0.1 atomic % and at most 10.0 atomic % is sputtered, the metallic film in which the ratio of the additive element(s) to the total amount of copper and the additive element(s) is at least 0.1 atomic % and at most 10.0 atomic % can be obtained.

The wiring film formed by the present invention has high adhesion to silicon and glass, no diffusion of copper into silicon and low resistance. Since the patterning in forming the wiring film can be performed with an identical etchant at a time, the production steps are simple.

BRIEF DESCRIPTION OF THE DRAWINGS

FIGS. 2(a) to 2(c) are sectional views for illustrating one example of steps of forming the wiring film of the present invention.

DETAILED DESCRIPTION OF THE INVENTION

Figure 1:
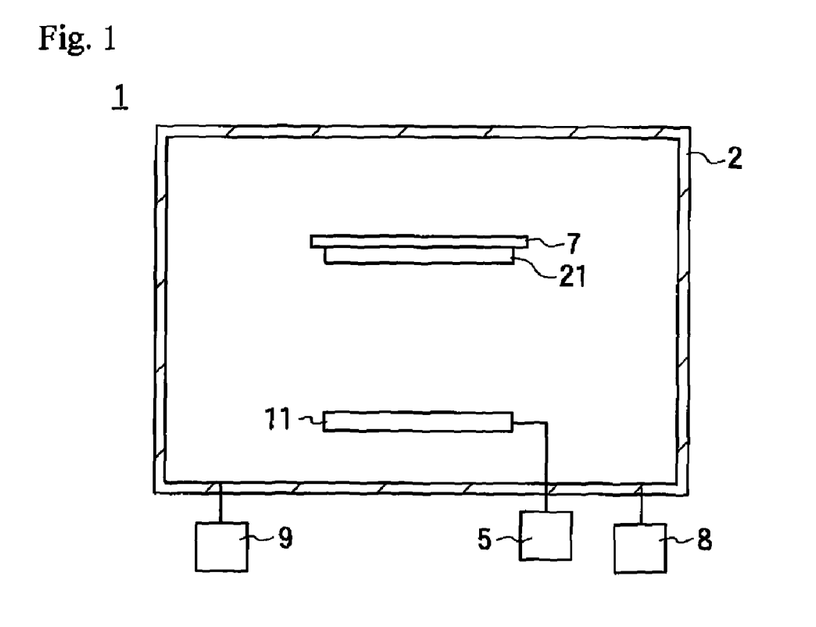
FIG. 1 is a sectional view for illustrating one embodiment of a sputtering apparatus to be used in the present invention.

In FIG. 1, a reference numeral 1 denotes a first embodiment of the sputtering apparatus to be used in the present invention, which has a vacuum chamber 2. Inside the vacuum chamber 2, a sputtering target 11 is arranged, which includes copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy.

A vacuum evacuation system 9 and a gas introducing system 8 are connected to the vacuum chamber 2; the interior of the vacuum chamber 2 is evacuated to vacuum ambience by the vacuum evacuation system 9; an object 21 to be film formed is carried therein at vacuum ambience; and the object is held by a substrate holder 7 arranged inside the vacuum chamber 2.

Figure 2A:
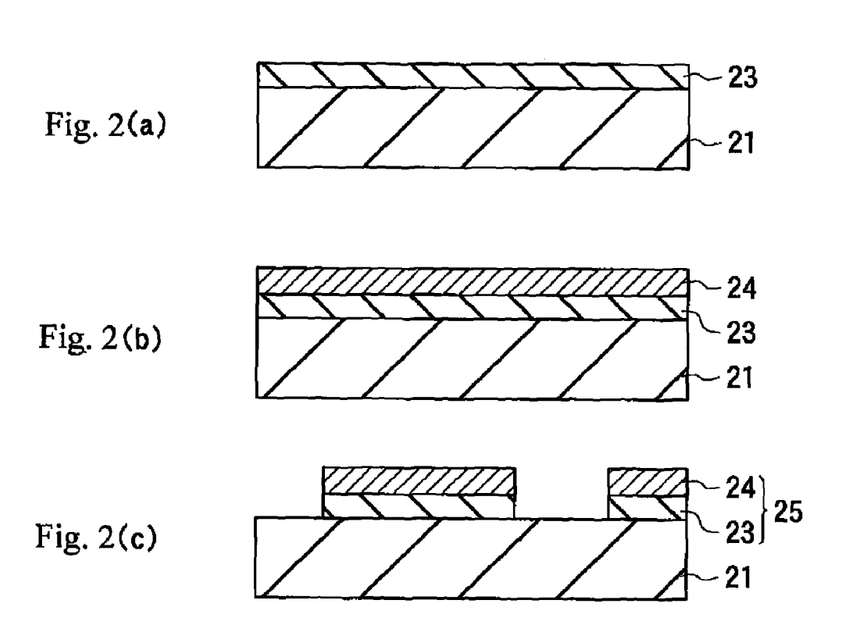

The sputtering target 11 is connected to an electric power source 5 disposed outside the vacuum chamber 2. While a sputtering gas and an oxygen gas are being introduced from the gas introducing system 8, a voltage is applied to the sputtering target 11 from an electric power source 5; and a plasma is formed near the surface of the sputtering target 11. When the sputtering target 11 is sputtered and particles of the material constituting the sputtering target 11 are emitted and reach the surface of the object 21 to be film formed, a first metallic film 23 including copper as a major component, oxygen and the above-mentioned element(s) is formed (FIG. 2(a)).

When the first metallic film 23 is formed in a predetermined film thickness, the introduction of the oxygen gas is stopped, while the introduction of sputtering gas and the vacuum evacuation are continued. In the same vacuum chamber 2, the same sputtering target 11 is sputtered in a state such that the partial pressure of the oxygen gas inside the vacuum chamber 2 is lowered than that of the oxygen gas when the first metallic film is formed; and a second metallic film including copper as a major component (the same kind of the additive element as included the first metallic film and oxygen of which the content amount is lower than the content amount of the first metallic film) is formed on the surface of the first metallic film.

The second metallic film 24 is preferably formed after the vacuum evacuation is performed such that the partial pressure of the oxygen gas inside the vacuum chamber 2 may be zero. In this situation, the second metallic film 24 containing no oxygen is formed.

After the second metallic film 24 is formed in a predetermined film thickness, the object is carried out of the vacuum chamber 2, and a first embodiment of the wiring film of the present invention is formed by etching the first and second metallic films 23, 24 in the same shape.

FIG. 2(c) is a sectional view of the first embodiment of the wiring film 25 as discussed above, and this wiring film 25 has a two-layer structure.

In the present invention, the first metallic film 23 and the second metallic film 24 both include copper as a major component. Thus, for forming the wiring film 25, when a patterned resist layer is arranged on a surface of a laminated film of the first and second metallic films 23 and 24, the first and second metallic films 23, 24 can be patterned in the same shape by etching this laminated film with an etching liquid (or an etching gas) having the same composition.

When the object 21 to be film formed is a panel of a liquid crystal display device, a surface of the glass substrate or a surface of a semiconductor layer of silicon or the like is exposed on a part of the surface or an entire surface of the object 21 to be film formed. When the object 21 to be film formed is a semiconductor device provided in an integrated circuit, an organic EL element or the like, a surface of the semiconductor substrate or the semiconductor layer (such as, silicon or the like) is exposed on a part of the surface or an entire surface of the object 21. That is, either one or both of glass and silicon are exposed on the surface of the object 21 to be film formed.

Since the first metallic film 23 contains the above-discussed additive element(s) and oxygen, it has enhanced adhesion to the glass substrate or silicon. Since the first metallic film 23 and the second metallic film 24 are metallic films including the same copper as a major component, adhesion therebetween has been enhanced. Therefore, the wiring film 25 formed by the present invention has high adhesion to the object 21.

Figure 3:
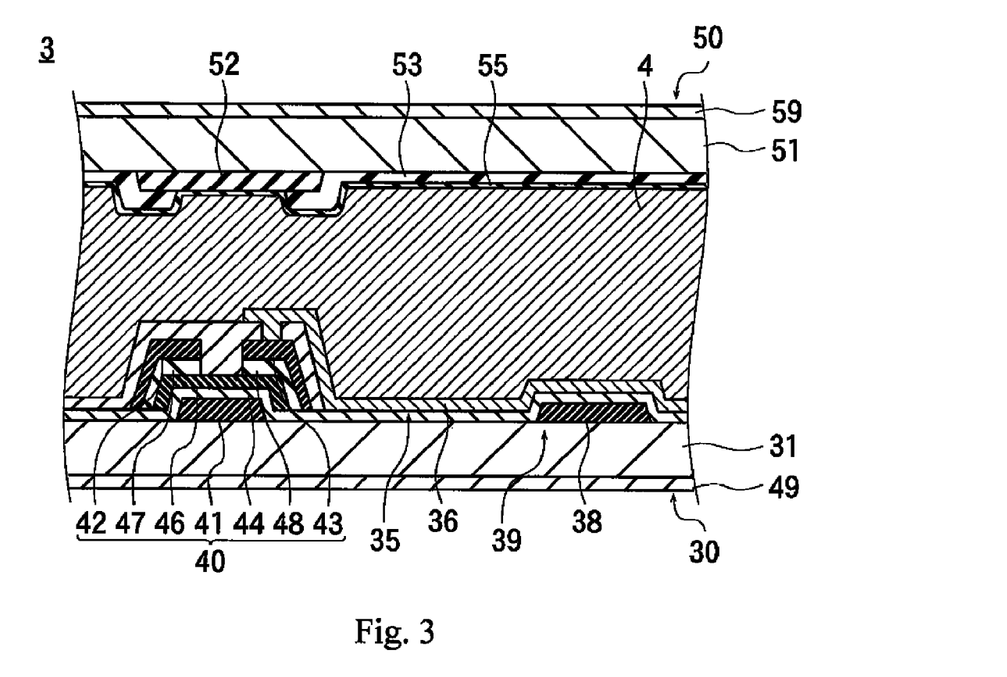
FIG. 3 is a sectional view for illustrating one embodiment of the liquid crystal display device of the present invention.

In FIG. 3, a reference numeral 3 denotes an electronic device (liquid crystal display device) having a wiring film of the present invention, which includes a TFT substrate 30 and a color filter substrate 50.

This liquid crystal display device 3 is of an active type. The TFT substrate 30 includes a glass substrate 31; and a TFT (thin film transistor) 40, a display pixel 35, and a storage condenser 39 are disposed on the glass substrate 31.

The TFT 40 includes a gate electrode 41, a drain electrode 42 and a source electrode 43; the storage condenser 39 has a storage electrode 38; and the display pixel 35 has a pixel electrode 36.

The gate electrode 41, the drain electrode 42, the source electrode 43 and the storage electrode 38 are constituted by wiring films 25 as discussed above. Further, the TFT 40 includes a gate insulating film 44, a channel semiconductor layer 46, a drain semiconductor layer 47 and a source semiconductor layer 48.

The drain semiconductor layer 47 and the source semiconductor layer 48 are arranged on one face of the channel semiconductor layer 46 and in contact with the channel semiconductor layer 46. The drain semiconductor layer 47 and the source semiconductor layer 48 are spaced apart from each other.

The gate insulating film 44 and the gate electrode 41 are arranged at a face of the channel semiconductor layer 46 opposite to the drain and semiconductor layer 47 and the source semiconductor layer 48 at a position therebetween. The gate insulting film 44 is positioned between the gate electrode 41 and the channel semiconductor layer 46.

The drain electrode 42 and the source electrode 43 are arranged in contact with the surfaces of the source semiconductor layer 48 and the drain semiconductor layer 47, respectively.

The gate electrode 41, the drain electrode 42 and the source electrode 43 are extended to the outside of the TFT 40 so that a voltage can be applied from an exterior electric power source.

The channel semiconductor layer 46 and the drain and source semiconductor layers 47, 48 are made of amorphous silicon, a polysilicon or the like.

The drain semiconductor layer 47 and the source semiconductor layer 48 are of the same electroconductive type of a p-type or n-type for electroconductive type, and the channel semiconductor layer 46 is of the same electroconductive type or an opposite electroconductive type relative to the drain semiconductor layer 47 and the source semiconductor layer 48.

First, a case such that the channel semiconductor layer 46 is of the same electroconductive type as that of the source and drain semiconductor layers 47, 48 will be explained.

The channel semiconductor layer 46 has a lower resistance by a higher impurity concentration as compared to the drain and source semiconductor layers 47, 48.

In the state in which an operating voltage is applied between the drain electrode 42 and the source electrode 43, when voltage is applied to the gate electrode 41 so as to induce charges having the same polarity as that of the drain and source semiconductor layers 47, 48 onto a surface of the channel semiconductor layer 46 a low-resistance accumulation layer is formed in the channel semiconductor layer 46 at a portion above the gate electrode 41, the drain semiconductor layer 47 and the source semiconductor layer 48 are connected through the accumulation layer, and the TFT is electrically conducted. No accumulation layer is formed when the gate voltage is not applied, so that the TFT 40 is cut off.

Next, a case where the electroconductive type of the channel semiconductor layer 46 is different from that of the source and drain semiconductor layers 47, 48 will be explained. When voltage that induces charges having a polarity opposite to that of the channel semiconductor layer 46 on the surface of the channel semiconductor layer 46 is applied to the gate electrode 41 in a state such that the operating voltage is applied between the drain electrode 42 and the source electrode 43, an inversion layer having the same electroconductive type as that of the source and drain semiconductor layers 47, 48 is formed in the channel semiconductor layer 46 at a portion above the gate electrode 41, so that the drain semiconductor layer 47 and the source semiconductor layer 48 are connected through the inversion layer, and the TFT is electrically conducted. No inversion layer is formed when a gate voltage is not applied, and the TFT 40 is cut off.

The pixel electrode 36 extended from the display pixel 35 is in contact with a part of the surface of the source electrode 43 so that the source electrode 43 is electrically connected to the pixel electrode 36.

The pixel electrode 36 is extended up to a position where the storage condenser 39 is located, and is arranged opposed to the storage electrode 38 disposed on the glass substrate 31 through an insulating film (gate insulation film 44). Thus, a storage condenser 39 is formed by an opposed portion.

Therefore, the electrode on one side of the storage condenser having a storage capacity is the storage electrode 38, and the electrode on the other side is the pixel electrode 36. The electrode on the other side is not limited to the pixel electrode 36, and it may be another electrode (common electrode 55, for example).

The TFT substrate 30 and the color filter substrate 50 are placed apart from each other by a constant distance, and a liquid crystal 4 is sealed therebetween.

In the color filter substrate 50, a black matrix 52 is arranged at a position opposed to the TFT 40; and a color filter 53 is arranged at a position opposed to the display pixel 35.

The common electrode 55 is arranged at least at a portion of the color filter substrate 50 opposed to the display pixel 35.

The pixel electrode 36 and the common electrode 55 are made of transparent metallic films (such as, ITO or the like).

The TFT substrate 30 and the color filter substrate 50 have polarization plates 49, 59, respectively. When a voltage is applied between the pixel electrode 36 and the common electrode 55 according to the turning on or cutting off of the TFT 40, the orientation of the liquid crystal 4 above the display pixel 35 changes, so that the polarized direction of the light passing through the liquid crystals 4 is changed; and thus, transmission of the light irradiated to the display pixel 35 to the outside of the liquid crystal display device 3 and the cutting off thereof are controlled.

The storage capacity is connected in parallel to a liquid crystal capacity formed between the pixel electrode 36 and the common electrode 55. When the TFT 40 is electrically conducted and the liquid crystal capacity between the pixel electrode 36 and the common electrode 55 is charged by the power supply voltage via the TFT 40, the storage capacity is also charged by the power supply voltage.

Even when the TFT 40 is turned so as to be cut off and the pixel electrode 36 is cut off from the power supply voltage, the same voltage as when the TFT 40 is tuned on is applied to the pixel electrode 36 by charges stored in the storage capacity, so that the polarized state of the liquid crystals 4 above the display pixel 35 is maintained. When this liquid crystal capacity is discharged, the polarized state of the liquid crystals 4 changes.

The storage electrode 38 and the gate electrode 41 are in contact with the glass substrate 31; and the drain electrode 42 and the source electrode 43 are in contact with the semiconductor layers (the drain semiconductor layer 47 and the source semiconductor layer 48).

The storage electrode 38, the gate electrode 41, the drain electrode 42 and the source electrode 43 are made of the wiring films 25 formed by the present invention, and the first metallic film 23 is in contact with the glass substrate 31 or the semiconductor layers 47, 48. Therefore, adhesion between the storage electrode 38, the gate electrode 41 and the glass substrate 31 is high; and adhesion among the drain electrode 42, the source electrode 43 and the semiconductor layers 47, 48 is also high.

Moreover, since the second metallic film 24 arranged on the first metallic film 23 contains no oxygen and has a lower resistance, the resistance in an extending direction of each electrode film (the direction orthogonal to that of the film thickness) is low.

The electronic device according to the present invention is not limited to the liquid crystal display device.

Figure 4:
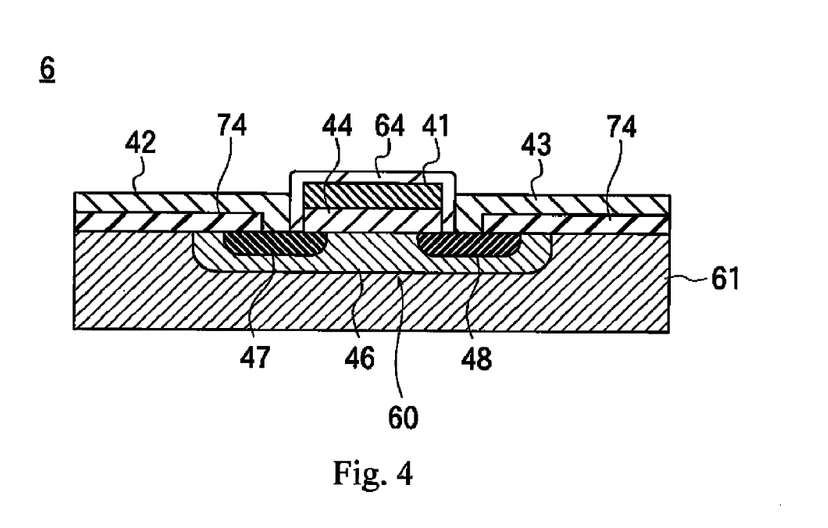
FIG. 4 is a sectional view for illustrating one embodiment of the semiconductor device of the present invention.

In FIG. 4, a reference numeral 6 generally denotes a part of a semiconductor device as another embodiment of the electronic device according to the present invention. In FIG. 4, a transistor 60 of the semiconductor device 6 is shown.

This transistor 60 includes the same parts as those of the TFT 40 shown in the above FIG. 3, except that it is not disposed on a glass substrate but has a semiconductor substrate (silicon substrate) 61. Thus, explanation is omitted for the same reference numerals directed to the same parts.

In this transistor 60, portions of the surfaces of the source semiconductor layer 48 and the drain semiconductor 47 are also exposed, and the first metallic film 23 of the source electrode 43 and the first metallic film 23 of the drain electrode 42 tightly adhere to the exposed portions, respectively.

Consequently, adhesion of the drain electrode 42 and the source electrode 43 to the silicon substrate 61 is high; and the first metallic film 23 prevents copper from diffusing into the silicon substrate 61.

Further, a reference numeral 64 in FIG. 4 denotes an insulating film in order to insulate the drain electrode 42 and the source electrode 43 from the gate electrode 41; and a reference numeral 74 of the same figure denotes an insulating film to insulate the drain electrode 42 and the source electrode 43 from a place other than the source semiconductor layer 48 and the drain semiconductor layer 47 of the silicon substrate 61.

Figure 9:
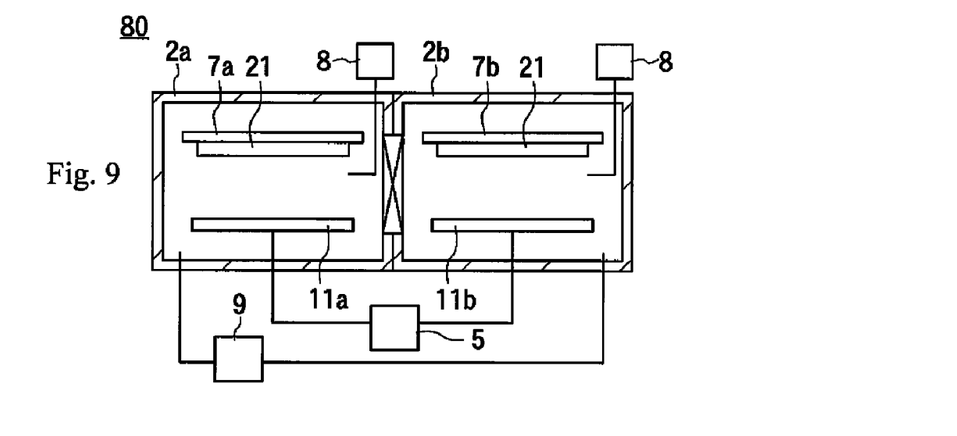
FIG. 9 is a sectional view for illustrating a second embodiment of the sputtering apparatus.

As discussed above, explanation has been made of the case where the first and second metallic films 23, 24 are formed by the same sputtering target 11, but the present invention is not limited thereto. In FIG. 9, a reference numeral 80 generally denotes a second embodiment of the sputtering apparatus; and this second embodiment of the sputtering apparatus 80 includes a first vacuum chamber 2a, a second vacuum chamber 2b connected to the first vacuum chamber 2a, a first sputtering target 11a arranged inside the first vacuum chamber 2a, and a second sputtering target 11b arranged inside the second vacuum chamber 2b.

A vacuum ambience is formed inside the first and second vacuum chambers 2a, 2b by a vacuum evacuation system 9. While the vacuum ambience is being maintained, an object 21 to be film formed is carried into the first vacuum chamber 2a, and held by a substrate holder 7a. The first sputtering target 11a contains copper as a major component and an additive element (s) as in the sputtering target 11 of the first embodiment of the sputtering apparatus 1.

As discussed above, when the vacuum ambience including the oxygen gas is formed inside the first vacuum chamber 2a and the first sputtering target 11a is sputtered, a first metallic film 23 is formed. The object 21 on which the first metallic film 23 is formed is carried from the first vacuum chamber 2a into the second vacuum chamber 2b, and held by a substrate holder 7b.

While the second vacuum chamber 2b is being vacuum evacuated, the sputtering gas is introduced, a vacuum ambience having a partial pressure of the oxygen gas lower than at the time of forming the first metallic film 23, is formed; and a second metallic film 24 is formed by sputtering a second sputtering target 11b at that vacuum ambience.

According to the first sputtering apparatus 1, since the first and second metallic films 23, 24 are formed while the partial pressure of the oxygen gas is varied inside the same vacuum chamber 2, a long time is required to perform a vacuum evacuation for a start of the formation of a next film after the one film is formed. To the contrary, according to the second sputtering apparatus 80, since first and second metallic films 23, 24 are formed in the different vacuum chambers, a short time period required to make the vacuum evacuation in each vacuum chamber suffices.

When the second sputtering target 11b includes copper as the major component and at least one kind of additive elements selected from the group consisting of Mg, Al, Si, Be, Ca, Sr, Ba, Ra, Sc, Y, La, Ce, Pr, Nd, Pm, Sm, Eu, Gd, Tb and Dy, the second metallic film 24 includes copper as a major component and the additive element (s), and a smaller oxygen content than that of the first metallic film 23 is obtained.

When the second sputtering target 11b is a pure copper target, the second metallic film 24 including copper as a major component and no additive element is formed. Meanwhile, when the partial pressure of oxygen is set to zero at the time of sputtering the second sputtering target 11b, the second metallic film 24 made of pure copper is formed.

When the first and second metallic films 23, 24 are patterned in the same shape, the second embodiment of the wiring film having the same structure as in the case of the wiring film, as shown by the reference numeral 25 of FIG. 2(*c*), can be obtained. Since pure copper has a resistance lower than the resistance of the copper containing the additive element(s), the resistance of the wiring film is reduced by using the pure copper target as the second sputtering target 11b.

The sputtering target made of pure copper may be arranged in the vacuum chamber of the same sputtering apparatus where the sputtering target containing the above additive element (s) is arranged. In this case, after the first metallic film 23 is formed, the application of the voltage to the sputtering target containing the additive element(s) is stopped, and the introduction of the oxygen gas is stopped, while the vacuum evacuation is being continued. When the oxygen gas is evacuated and the inner pressure of the vacuum chamber is reduced to a predetermined pressure, the second metallic film is formed by sputtering the sputtering target made of pure copper, while the sputtering gas is being introduced into the vacuum chamber.

In this way, when the first and second metallic films 23, 24 are continuously formed in the same vacuum chamber, the film quality of the wiring film is improved because the first and second metallic films 23, 24 are not in contact with the open atmosphere. In addition, the wiring film formed by the present invention is not limited to the two-layer structure of the first and second metallic films 23, 24, and one or more metallic layers including copper as a major component may be formed on a surface of the second metallic film 24.

Figures 5A, 5B:
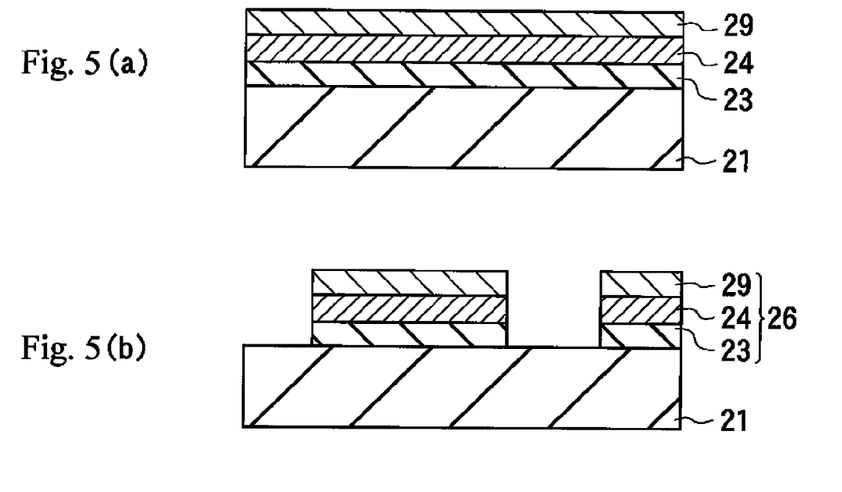
FIGS. 5(a) and 5(b) are sectional views for illustrating another example of steps of forming the wiring film of the present invention.

For example, after the second metallic film 24 is formed, the sputtering target 11 including Cu as a major component and one or more kinds of the additive elements is sputtered in the vacuum ambience having a partial pressure of the oxygen gas higher than at the time of the formation of the second metallic film 24. A third metallic film 29 including Cu as a major component, oxygen and the additive element is formed on the surface of the second metallic film 24 (FIG. 5(*a*)).

Since each of the first to third metallic films 23, 24, 29 contains copper as a major component, the wiring film 26 can be formed by patterning them altogether with the use of an etchant (etching liquid or etching gas) having the same component (FIG. 5(*b*)).

Since the third metallic film 29 containing oxygen and the additive element(s) is exposed to a surface of the wiring film 26, it exhibits high adhesion when an oxide (such as, ITO, $SiO_2$ or the like) is tightly adhered to the wiring film 26. In addition, when silicon contacts a surface of the wiring film 26, no diffusion of the metal occurs.

This wiring film 26 can be used as any of the gate electrode 41, the drain electrode 42, the source electrode 43 and the storage electrode 38, as discussed above.

More particularly, when the metallic oxide film of ITO, ZnO or the like (pixel electrode 36) tightly adheres to, for example, the surface of the source electrode 43 of the liquid crystal display device 3, oxygen does not move from the pixel electrode 36 to the source electrode 43 by the presence of the third metallic film 29 containing oxygen at the surface, so that the second metallic film 24 is not oxidized; and the electric resistance of the source electrode 43 does not rise.

The first to third metallic films 23, 24 and 29 may be formed by sputtering the same sputtering target 11 inside the same vacuum chamber, or they may be formed by sputtering different sputtering targets inside the same vacuum chamber.

Alternatively, at least the second metallic film 24 among the first to third metallic films 23, 24 and 29 may be formed in a vacuum chamber different from that for the first and third metallic films 23, 29.

More specifically, the above-discussed second sputtering apparatus 80 is used; the first metallic film 23 is formed inside the first vacuum chamber 2a; the second metallic film 24 is formed inside the second vacuum chamber 2b; and thereafter, the object 21 to be film formed is returned from the second vacuum chamber 2b to the first vacuum chamber 2a. The oxygen gas and the sputtering gas are introduced into the first vacuum chamber 2a in order to form the vacuum ambience having a higher partial pressure of the oxygen gas than at the formation of the second metallic film 24; and the third metallic film 29 is formed by sputtering the first sputtering target 11a in this vacuum ambience.

Further, the respective metallic films may be formed inside separate vacuum chambers.

Figure 10:
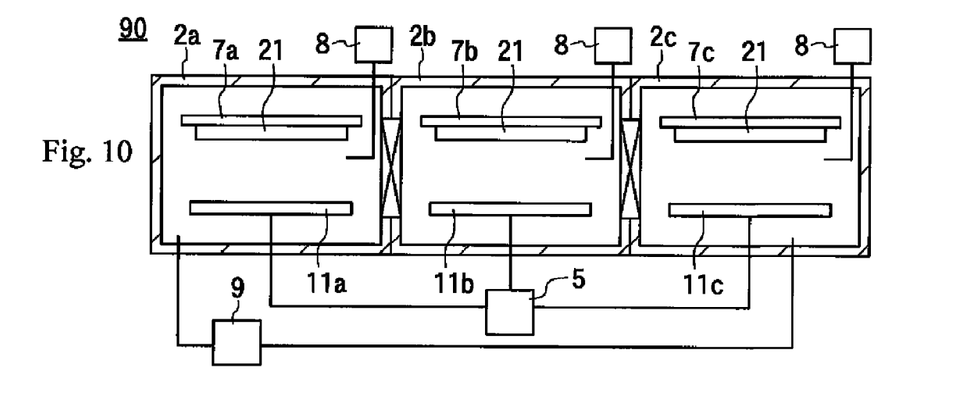
FIG. 10 is a sectional view for illustrating a third embodiment of the sputtering apparatus.

In FIG. 10, a reference numeral 90 generally refers to a third embodiment of the sputtering apparatus. This sputtering apparatus 90 includes first and second vacuum chambers 2a, 2b and also a third vacuum chamber 2c connected to the second vacuum chamber 2b.

As in the use of the second sputtering apparatus 80, a first metallic film 23 is formed inside the first vacuum chamber 11a; a second metallic film 24 is formed inside the second vacuum chamber 11b; and thereafter, the object 21 to be film formed is carried into the third vacuum chamber 11c in which the vacuum ambience has been preliminarily formed, and is held by the substrate holder 7c.

Arranged inside the third vacuum chamber 2c is a third sputtering target 11c including copper as the major component and at least one kind of an additive elements selected from the additive element group consisting of Mg, Al, Si, Be, Ca, Sr, Ba, Ra, Sc, Y, La, Ce, Pr, Nd, Pm, Sm, Eu, Gd, Tb and Dy.

While the interior of the third vacuum chamber 2c is being vacuum evacuated, the sputtering gas and the oxygen gas are introduced from the gas introducing system 8; the vacuum ambience having a higher partial pressure of the oxygen gas than the partial pressure of the oxygen gas at the formation of the second metallic film 24 is formed; and the third metallic film 29 is formed by sputtering the third sputtering target 11c.

In order to form the first to third metallic films 23, 24 and 29 inside the same vacuum chamber 2, the vacuum chambers having different partial pressures of the oxygen gas need to be alternatively formed inside the vacuum chamber; and it takes a long time to perform the vacuum evacuation until the formation of a next film after the formation of one film is finished. According to the second and third sputtering apparatuses 80, 90, since at least the second metallic film 24 is formed in the separate vacuum chamber, it does not take a long time for the vacuum evacuation.

Further, in order to reduce the resistance of the entire wiring films 25, 26, the thickness of the second metallic film 24 is made thicker than those of the first and third metallic films 23, 29. For this purpose, the film forming time period for the second metallic film 24 is longer than the film forming time period for the first and third metallic films 23, 29. According to the second and third sputtering apparatuses 80 and 90, the productivity is improved if a film that requires a long time to form it is formed in an exclusive vacuum chamber.

Furthermore, like the third embodiment of the sputtering apparatus 90, the productivity is further improved, if the number of the vacuum chambers 2a to 2c is made equal to the number of the copper films constituting the wiring film 25, 26; and the respective copper films are formed inside the exclusive vacuum chambers 2a to 2c.

In the second sputtering apparatus 80, the first and second vacuum chambers 2a, 2b may be directly connected as shown in FIG. 9, or it may be that the first and second vacuum chambers 2a, 2b are connected to the same transfer chamber, and the object 21 to be film formed is carried in and out between the first and second vacuum chamber 2a, 2b through the transfer chamber.

Moreover, according to the third sputtering apparatus 90, as shown in FIG. 10, the first to third vacuum chambers 2a to 2c are connected in series so that the object 21 to be film formed may be carried from the first vacuum chamber 2a into the third vacuum chamber 2c through the second vacuum chamber 2b. Furthermore, the first to third vacuum chambers 2a to 2c may be connected to the same transfer chamber; and the object 21 to be film formed is carried into and out the first to third vacuum chambers 2a to 2c through the transfer chamber.

In any case, since the object 21 to be film formed moves among the vacuum chambers without being in contact with the open atmosphere, the wiring films 25, 26 having a good film quality can be obtained.

In the case in which the electronic device is the semiconductor device 6, the drain semiconductor layer 47, the source semiconductor layer 48 and the channel semiconductor layer 46 are formed by diffusing impurities into the silicon substrate 61. In the case in which the electronic device is the liquid crystal display device, the semiconductor device 6, the drain semiconductor layer 47, the source semiconductor layer 48 and the channel semiconductor layer 46 are formed by depositing a semiconductor (such as, silicon or the like) on a surface of the glass substrate 31 by a CVD method or the like. Further, the insulating films (such as, the gate insulating film 44 or the like) are made of a nitride film (such as, silicon nitride or the like) or an oxide film (such as, silicon oxide or the like).

In the above, the case in which each of the gate electrode 41, the drain electrode 42, the source electrode 43 and the storage electrode 38 is constituted with the wiring film 25 formed by the present invention; however, the present invention is not limited thereto. At least any one of the gate electrode 41, the drain electrode 42, the source electrode 43 and the storage electrode 38 may be constituted with the wiring film 25 formed by the present invention. However, as discussed above, it is desirable that the electrodes in direct contact with the glass substrate, the silicon substrate or the semiconductor layer are constituted with the wiring films 25 formed by the present invention.

As discussed above, the case where only Al is included into the sputtering target 11 as the additive element; however, the present invention is not limited thereto. A metallic film containing an additive element(s) other than Al may be formed through the film formation with use of a sputtering target containing at least one kind of additive elements selected from the additive element group consisting of Mg, Si, Be, Ca, Sr, Ba, Ra, Sc, Y, La, Ce, Pr, Nd, Pm, Sm, Eu, Gd, Tb and Dy other than Al.

A metallic film containing two or more kinds of the additive elements may be formed by including the two or more kinds of the additive elements into the same sputtering target. When three or more layers of metallic films are to be laminated as shown in FIGS. 5(a) and (b), the sputtering targets to be used to form the first to third metallic films 23, 24 and 29 may be identical; alternatively, targets into which different additive elements are respectively included may be used.

EXAMPLE 1

Glass substrates and silicon substrates are used as objects 21 to form films thereon, the film forming conditions being as follows: the contents (0.1 atomic %, 2.0 atomic %, 10.0 atomic %) of an additive element (Al) of sputtering targets, ratios (zero, 0.1%, 3.0%, 10.0%, 20.0%) of the partial pressures of the oxygen gas to the partial pressures of the sputtering gas (Ar) during sputtering, and annealing temperatures (not annealed, 350° C., 450° C.) after the film formation are combined, and a single layer of a metallic film is formed on a surface of the object 21 to be film formed for each combination.

In this case, the introduced amount of the sputtering gas is set such that the total pressure inside the vacuum chamber 2 might be 0.4 Pa when the introduced amount of the oxygen gas is zero and only sputtering gas (Ar) is introduced. In each combination, the partial pressure of the sputtering gas is set at a constant value (0.4 Pa) without changing the introduced amount of the sputtering gas. The ratio of the partial pressure of the oxygen gas to that of the sputtering gas is a value obtained by dividing the partial pressure of the oxygen gas by that of the sputtering gas (0.4 Pa) and multiplying the quotient by 100.

<Adhesion Test>

With respect to the metallic films formed by the combinations shown in the following Table 1 among the metallic films formed on surfaces of the glass substrates, all 100 of 1 mm grid squares are formed in 10 lines×10 columns with a tip-sharp cutter knife, and an adhesive tape (No. 610 Scotch tape) is adhered thereto. Then, the number of the remaining films after the adhesive tape is peeled, is counted. Results thereof are shown in the following Table 1.

TABLE 1

Adhesion test

| Additive element | Content [atomic %] | $O_2$ ratio [%] | Anneal temperature (° C.) | | |
|---|---|---|---|---|---|
| | | | Not annealed | 350 | 450 |
| Al | 0.1 | 0 | 11/100 | 16/100 | 21/100 |
| | | 0.1 | 89/100 | 95/100 | 96/100 |
| | | 3.0 | 92/100 | 100/100 | 100/100 |
| | | 10.0 | 100/100 | 100/100 | 100/100 |
| | | 20.0 | 100/100 | 100/100 | 100/100 |
| | 2.0 | 0 | 49/100 | 58/100 | 65/100 |
| | | 0.1 | 100/100 | 100/100 | 100/100 |
| | | 3.0 | 100/100 | 100/100 | 100/100 |
| | | 10.0 | 100/100 | 100/100 | 100/100 |
| | | 20.0 | 100/100 | 100/100 | 100/100 |
| | 10.0 | 0 | 79/100 | 84/100 | 85/100 |
| | | 0.1 | 100/100 | 100/100 | 100/100 |
| | | 3.0 | 100/100 | 100/100 | 100/100 |
| | | 10.0 | 100/100 | 100/100 | 100/100 |
| | | 20.0 | 100/100 | 100/100 | 100/100 |

In Table 1, when all the metallic film is peeled from the glass substrate, the evaluation is 0/100, whereas when none is peeled, the evaluation is 100/100. Thus, the greater the number of the numerator, the higher is the adhesion. As seen from the above Table 1, even when the content of Al is equal, the higher the ratio of the oxygen gas, the greater the adhesion. Further, it is seen that even when the ratio of the oxygen gas is equal, the higher the content of Al, the higher is the adhesion.

Even when the content of Al in the sputtering target is as low as 0.1 atomic %, the metallic film is not peeled if the ratio of oxygen is at least 10.0%. Therefore, it is presumed that even if the content of Al of the sputtering target is less than 0.1 atomic %, the metallic film is not peeled when the introduced amount of the oxygen gas is 10% or more during sputtering.

<Specific Resistance Measurement>

Specific resistance is measured with respect to the metallic films formed by the combinations of the film forming conditions shown in the following Table 2 among the metallic films formed on the surfaces of the glass substrates. Measuring results thereof are shown in the following Table 2.

TABLE 2

| Additive element | Content [atomic %] | $O_2$ ratio [%] | After anneal at 350° C. Specific resistance [μΩ cm] |
|---|---|---|---|
| Al | 0 | 0 | 2.1 |
| | | 1.0 | 4.0 |
| | | 3.0 | 6.0 |
| | | 10.0 | 7.2 |
| | | 20.0 | 8.0 |
| | 0.1 | 0 | 2.7 |
| | | 1.0 | 6.2 |
| | | 3.0 | 9.9 |
| | | 10.0 | 12.5 |
| | | 20.0 | 16.6 |
| | 2.0 | 0 | 3.1 |
| | | 1.0 | 7.3 |
| | | 3.0 | 12.1 |
| | | 10.0 | 18.9 |
| | | 20.0 | 26.9 |
| | 10.0 | 0 | 3.5 |
| | | 1.0 | 12.2 |
| | | 3.0 | 19.9 |
| | | 10.0 | 32.1 |
| | | 20.0 | 49.7 |

Figure 6:
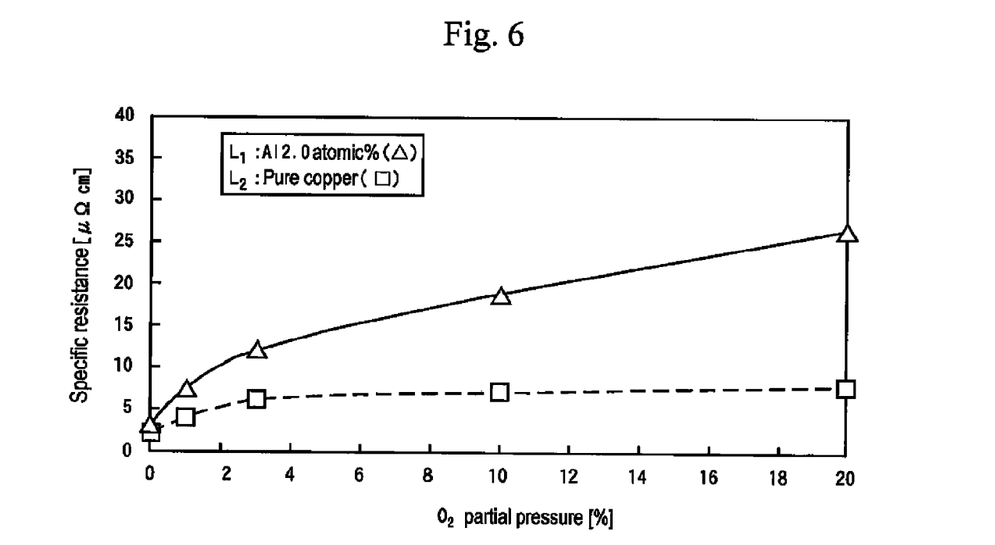
FIG. 6 is a graph showing the relationship between the ratio of the partial pressure of the oxygen gas and the specific resistance (Al).

FIG. 6 is a graph showing the relationship between the ratio of the oxygen partial pressure and the specific resistance as determined from the measurement results. A curve shown by a reference sign $L_1$ corresponds to a case where sputtering targets containing 2.0 atomic % of Al are used; and a reference sign $L_2$ of the same figure corresponds to a case where sputtering targets containing no additive element (pure copper) are used.

As is seen from the above Table 2 and FIG. 6, when the oxygen gas is not introduced, the resistance value of copper is equivalent to that of the metallic film containing Al. Even if the contents of Al in the target is not varied, the specific resistance increases as the ratio of the partial pressure of the oxygen gas increases.

Since the atomic radius of Al is smaller than that of Cu, Al is precipitated in crystal grain boundaries of Cu in the case of the film formed with the sputtering gas only, and with increase in the partial pressure of oxygen, the precipitated Al is positively oxidized so that the resistance value increases with the increase in the partial pressure of the oxygen gas.

In addition, as is clear from the above Table 2, even when the partial pressure of the oxygen gas is equal, the greater the Al content, the higher the specific resistance.

When a specific resistance of a metallic film formed under a combination in which the partial pressure of the oxygen gas was zero and the content of Al was zero is compared to a specific resistance of a metallic film formed under a combination in which the partial pressure of the oxygen gas was zero and Al was contained, the resistance value is equivalent even when the content of Al is as much as 10 atomic %, if the partial pressure of the oxygen gas is zero.

Further, as shown in Table 2, the specific resistance (49.7 μΩcm) is the maximum when the content of Al in the sputtering target is 10 atomic % and the ratio of the partial pressure of the oxygen gas is 20.0%. This value is an upper limit of values usable as the first metallic film 23 of the above wiring film.

<Barrier Property>

With respect to the metallic films formed by the combinations shown in the following Table 3 among the metallic films formed on surfaces of the silicon substrates, whether the metal is diffused into the silicon substrate or not is examined. Results thereof are shown in the following Table 3.

TABLE 3

Barrier property

| Additive element | Content [atomic %] | O₂ ratio [%] | Diffusion into Si |
|---|---|---|---|
| Al | 0 | 0 | Diffused |
|  |  | 0.1 | Diffused |
|  |  | 3.0 | Diffused |
|  |  | 10.0 | Diffused |
|  |  | 20.0 | Diffused |
|  | 0.1 | 0 | Diffused |
|  |  | 0.1 | None |
|  |  | 3.0 | None |
|  |  | 10.0 | None |
|  |  | 20.0 | None |
|  | 2.0 | 0 | Diffused |
|  |  | 0.1 | None |
|  |  | 3.0 | None |
|  |  | 10.0 | None |
|  |  | 20.0 | None |
|  | 10.0 | 0 | Diffused |
|  |  | 0.1 | None |
|  |  | 3.0 | None |
|  |  | 10.0 | None |
|  |  | 20.0 | None |

It is seen from the above Table 3 that the diffusion of the metal into the silicon substrate is confirmed when no oxygen was added, whereas the metal is prevented from diffusing into the silicon substrate by adding oxygen. Furthermore, with respect to the metallic films formed on the surfaces of the silicon substrates, there is a tendency for the content of Al to be greater, the higher the adhesion. Thus, when the sputtering target containing Al is used and sputtering is performed under the introduction of oxygen, a metallic film having high adhesion to the silicon substrate and excellent barrier property to the silicon substrate can be obtained.

As mentioned above, the specific resistance and the adhesion are examined with respect to Al, while the content and the partial pressure of oxygen were changed. Meanwhile, with respect to additive elements other than Al, when the content in the sputtering target 11 is at least 0.1 atomic %, the adhesion of the metallic film is also high. When the content in the sputtering target 11 is 10 atomic % and the ratio of the partial pressure of the oxygen gas is 20.0%, the specific resistance of the metallic film is less than the usable upper limit.

Furthermore, regarding the barrier property, when the sputtering target 11 containing the additive element other than Al is used, copper does not diffuse into the silicon substrate if the oxygen gas is introduced at the time of sputtering.

<Kinds of Additive Elements>

Single layers of metallic films are formed on surfaces of glass substrates, while film forming conditions are as follows: annealing temperatures (350° C., 450° C.) and ratios (5.0%, 7.5%, 10.0%) of the partial pressures of the oxygen gas to that of the sputtering gas are combined with sputtering targets containing additive elements shown in the following Table 4. With respect to each metallic film, "Adhesion test" and "Specific resistance measurement" as discussed above are examined. Measurement results are shown in the following Table 4 together with the film forming conditions.

TABLE 4

| Kinds of additive elements | | | | | |
|---|---|---|---|---|---|
| Additive element [Each: 2.0 atomic %] | O₂ ratio [%] | After annealing at 350° C. | | After annealing at 450° C. | |
|  |  | Specific resistance | Adhesion | Specific resistance | Adhesion |
| — | — | 2.1 | 30/100 | 2.0 | 35/100 |
| Al | 10.0 | 18.9 | 100/100 | 18.8 | 100/100 |
| Si | 10.0 | 18.5 | 100/100 | 18.4 | 100/100 |
| Be | 7.5 | 15.5 | 100/100 | 14.3 | 100/100 |
| Ca | 5.0 | 5.1 | 100/100 | 5.0 | 100/100 |
| Sr | 7.5 | 8.8 | 100/100 | 8.5 | 100/100 |
| Ba | 10.0 | 8.1 | 100/100 | 7.9 | 100/100 |
| Sc | 10.0 | 17.3 | 100/100 | 17.1 | 100/100 |
| Sc | 0 | 2.3 | 55/100 | 2.2 | 57/100 |
| Y | 5.0 | 7.7 | 100/100 | 7.4 | 100/100 |
| La | 7.5 | 9.1 | 100/100 | 8.5 | 100/100 |
| Ce | 10.0 | 17.6 | 100/100 | 17.5 | 100/100 |
| Pr | 5.0 | 7.4 | 100/100 | 7.1 | 100/100 |
| Nd | 10.0 | 14.7 | 100/100 | 14.4 | 100/100 |
| Nd | 0 | 2.5 | 61/100 | 2.4 | 59/100 |
| Pm | 7.5 | 7.2 | 100/100 | 7.1 | 100/100 |
| Sm | 15.0 | 19.3 | 100/100 | 18.9 | 100/100 |
| Eu | 10.0 | 19.9 | 100/100 | 19.7 | 100/100 |
| Gd | 5.0 | 8.8 | 100/100 | 8.5 | 100/100 |
| Tb | 10.0 | 15.5 | 100/100 | 15.4 | 100/100 |
| Dy | 7.5 | 13.3 | 100/100 | 13.1 | 100/100 |

As is clear from the above Table 4, regarding the elements other than Al, the metallic films do not peel and adhesion is high if the oxygen gas is introduced at the time of sputtering. Further, the specific resistance of each metallic film is within such a range as usable for the underlying layers of the wiring films.

<Film Composition>

With respect to sputtering targets 11 into which Al, Si, Sc, Y and Ce are contained as additive elements by 0.2 atomic %, respectively, single layers of metallic films are formed under combinations of film forming conditions shown in the following Tables 5 to 9 with the contents of the additive elements and the ratio of the partial pressures of the oxygen gas to that of the sputtering gas.

With respect to each metallic film formed, the contents of oxygen are measured by an XPS method (X-ray photoelectron spectroscopy), respectively. Measuring results thereof are given in the following Tables 5 to 9.

TABLE 5

Film composition (Cu—Al)

| O₂ ratio [%] | 0 [atomic %] |
|---|---|
| 5 | 3.5 |
| 10 | 4.8 |
| 15 | 6.7 |

TABLE 6

Film composition (Cu—Si)

| O₂ ratio [%] | 0 [atomic %] |
|---|---|
| 5 | 2.8 |
| 10 | 4.3 |
| 15 | 5.8 |

TABLE 7

Film composition (Cu—Sc)

| O₂ ratio [%] | O [atomic %] |
|---|---|
| 5 | 5.5 |
| 10 | 7.0 |
| 15 | 8.6 |

TABLE 8

Film composition (Cu—Y)

| O₂ ratio [%] | O [atomic %] |
|---|---|
| 5 | 5.4 |
| 10 | 6.5 |
| 15 | 8.2 |

TABLE 9

Film composition (Cu—Ce)

| O₂ ratio [%] | O [atomic %] |
|---|---|
| 5 | 5.0 |
| 10 | 6.7 |
| 15 | 7.4 |

It is confirmed from the above Tables 5 to 9 that in any of the additive elements, the higher the partial pressure of the oxygen gas at the time of sputtering, the greater the content of the oxygen atoms contained in the metallic film. Next, examples with an additive element being Mg will be explained.

EXAMPLE 2

Glass substrates and silicon substrates were used as objects 21 to be film formed, film forming conditions being as follows: the contents (zero, 0.1 atomic %, 2.0 atomic %, 10.0 atomic %) of Mg of sputtering targets, ratios (zero, 0.1%, 3.0%, 10.0%, 20.0%) of the partial pressures of the oxygen gas to that of the sputtering gas (Ar) at the time of sputtering, and annealing temperatures (not annealed, 350° C., 450° C.) after the film formation are combined; and a single layer of a metallic film is formed on a surface of the object 21 to be film formed for each combination.

In this case, the introduced amount of the sputtering gas is set such that the total pressure inside the vacuum chamber 2 might be 0.4 Pa when the introduced amount of the oxygen gas is zero and only sputtering gas (Ar) is introduced. In each combination, the partial pressure of the sputtering gas is set at a constant value (0.4 Pa) without changing the introduced amount of the sputtering gas. The ratio of the partial pressure of the oxygen gas to that of the sputtering gas is a value obtained by dividing the partial pressure of the oxygen gas by that of the sputtering gas (0.4 Pa) and multiplying the quotient by 100.

<Adhesion Test>

With respect to each metallic film formed on a surface of the glass substrate, all 100 of 1 mm grid squares are formed in 10 lines×10 columns with a tip-sharp cutter knife; and an adhesive tape (No. 610 Scotch tape) is adhered thereto. Then, the number of the remaining films is counted after the adhesive tape is peeled. Results thereof are shown in the following Table 10.

TABLE 10

Adhesion test

| Additive element | Content [atomic %] | O₂ ratio [%] | Anneal temperature (° C.) Not annealed | 350 | 450 |
|---|---|---|---|---|---|
| Mg | 0 | 0 | 30/100 | 28/100 | 35/100 |
| | | 0.1 | 48/100 | 52/100 | 57/100 |
| | | 3.0 | 77/100 | 81/100 | 79/100 |
| | | 10.0 | 92/100 | 93/100 | 91/100 |
| | | 20.0 | 99/100 | 97/100 | 98/100 |
| | 0.1 | 0 | 19/100 | 24/100 | 30/100 |
| | | 0.1 | 99/100 | 97/100 | 99/100 |
| | | 3.0 | 97/100 | 100/100 | 100/100 |
| | | 10.0 | 100/100 | 100/100 | 100/100 |
| | | 20.0 | 100/100 | 100/100 | 100/100 |
| | 2 | 0 | 53/100 | 61/100 | 63/100 |
| | | 0.1 | 100/100 | 100/100 | 100/100 |
| | | 3.0 | 100/100 | 100/100 | 100/100 |
| | | 10.0 | 100/100 | 100/100 | 100/100 |
| | | 20.0 | 100/100 | 100/100 | 100/100 |
| | 10 | 0 | 81/100 | 80/100 | 82/100 |
| | | 0.1 | 100/100 | 100/100 | 100/100 |
| | | 3.0 | 100/100 | 100/100 | 100/100 |
| | | 10.0 | 100/100 | 100/100 | 100/100 |
| | | 20.0 | 100/100 | 100/100 | 100/100 |

In this case, when all the metallic film is peeled from the glass substrate, the evaluation is 0/100, whereas when none is peeled, the evaluation is 100/100. Thus, the greater the number of the numerator, the higher is the adhesion.

As seen from the above Table 10, even when the content of Mg is identical, the higher the partial pressure of the oxygen gas, the greater is the adhesion. Further, it is seen that even when the ratio of the oxygen gas is equal, the higher the content of Mg, the higher is the adhesion.

Even when the content of Mg in the sputtering target is as low as 0.1 atomic %, the metallic film is not peeled if the ratio of oxygen is at least 10.0%. Therefore, it is presumed that even if the content of Mg of the sputtering target is less than 0.1 atomic %, the metallic film is not peeled when the introduced amount of the oxygen gas is 10% or more at the time of the sputtering.

<Specific Resistance>

Among the metallic films formed on the surfaces of the glass substrates, measurements are made of specific resistance of the metallic films in the case in which the contents of Mg of the sputtering targets (0.1 atomic %, 2.0 atomic %, 10.0 atomic %), the ratios of the partial pressure of the oxygen gas to that of the sputtering gas at the time of sputtering (zero, 1.0%, 3.0%, 10.0%, 20.0%) and the annealing temperatures of 350° C. are combined. Measured results thereof are shown in the following Table 11.

TABLE 11

Specific resistance

| Additive element | Content [atomic %] | O₂ ratio [%] | After annealing at 350° C. Specific resistance [μΩ cm] |
|---|---|---|---|
| Mg | 0.1 | 0 | 2.3 |
| | | 1.0 | 4.9 |
| | | 3.0 | 8.7 |
| | | 10.0 | 10.2 |
| | | 20.0 | 14.2 |
| | 2 | 0 | 2.3 |
| | | 1.0 | 6.9 |
| | | 3.0 | 11.1 |
| | | 10.0 | 16.5 |
| | | 20.0 | 24.6 |
| | 10 | 0 | 3.1 |

TABLE 11-continued

Specific resistance

| Additive element | Content [atomic %] | $O_2$ ratio [%] | After annealing at 350° C. Specific resistance[μΩ cm] |
|---|---|---|---|
| | | 1.0 | 11.3 |
| | | 3.0 | 17.9 |
| | | 10.0 | 28.8 |
| | | 20.0 | 43.8 |

Figure 8:
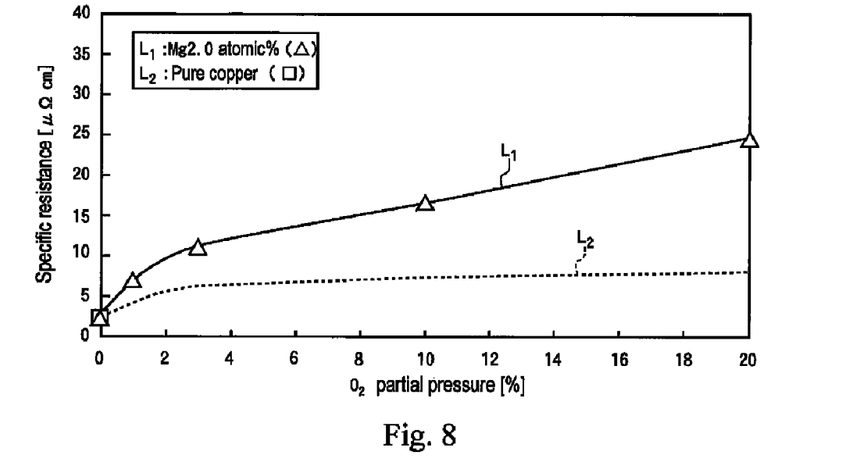
FIG. 8 is a graph showing the relationship between the ratio of the partial pressure of the oxygen gas and the specific resistance (Mg).

FIG. 8 is a graph showing the relationship between the ratio of the oxygen partial pressure and the specific resistance as determined from the measurement results. A curve shown by a reference sign $L_1$ corresponds a case where a sputtering target containing 2.0 atomic % of Mg is used.

Further, in FIG. 8, the relationship between the ratio of the partial pressure of the oxygen gas and the specific resistance in a case where the sputtering target containing no Mg (pure copper) is used is depicted as a curve $L_2$.

As is seen from the above Table 11 and FIG. 8, even if the content of Mg in the target is not varied, the specific resistance increases as the ratio of the partial pressure of the oxygen gas is increased. As is clear from the above Table 11, even when the ratio of the partial pressure of the oxygen gas is equal, the higher the content of Mg, the greater is the specific resistance.

The specific resistance of a metallic film, formed under a combination of the partial pressure of the oxygen gas being zero and the content of Mg being zero, is 2.3 μΩcm. Compared to a measured result in a case in which Mg is contained in the sputtering target, when the partial pressure of the oxygen gas is zero, the resistance value is equivalent even if the content of Mg is as much as 10 atomic %.

As shown in Table 11, the specific resistance (43.8 μΩcm) is the maximum when the content of Mg in the sputtering target is 10 atomic % and the ratio of the partial pressure of the oxygen gas is 20.0%. This value is an upper limit of values usable as the first metallic film 23 of the above-discussed wiring film.

<Barrier Property>

Among the metallic films formed on the surfaces of the silicon substrates, whether the metal diffused into the silicon substrates or not is examined with respect to metallic films formed under the combinations: the contents of Mg of the sputtering targets are zero, 0.1 atomic %, 2.0 atomic % and 10.0 atomic %; the ratios of the partial pressures of the oxygen gas to the partial pressure of the sputtering gas during sputtering are zero, 0.1%, 3.0%, 10.0% and 20.0%; and the annealing temperature is 450° C. Results thereof are shown in the following Table 12.

TABLE 12

Barrier property

| Additive element | Content [atomic %] | $O_2$ ratio [%] | After annealing at 450° C. Diffusion into Si |
|---|---|---|---|
| Mg | 0 | 0 | Diffused |
| | 0.1 | 0 | Diffused |
| | | 0.1 | None |
| | | 3.0 | None |
| | | 10.0 | None |
| | | 20.0 | None |
| | 2.0 | 0 | Diffused |
| | | 0.1 | None |
| | | 3.0 | None |
| | | 10.0 | None |
| | | 20.0 | None |

TABLE 12-continued

Barrier property

| Additive element | Content [atomic %] | $O_2$ ratio [%] | After annealing at 450° C. Diffusion into Si |
|---|---|---|---|
| | 10.0 | 0 | Diffused |
| | | 0.1 | None |
| | | 3.0 | None |
| | | 10.0 | None |
| | | 20.0 | None |

As shown in the above Table 12, the diffusion of the metal into the silicon substrate is confirmed when no oxygen is incorporated, whereas the metal is prevented from diffusing into the silicon substrate by incorporating oxygen.

Furthermore, with respect to the metallic films formed on the surfaces of the silicon substrates, there is a tendency for the content of Mg to be greater, the higher the adhesion. Thus, it is seen that when the sputtering target containing Mg is used and sputtering is performed under the introduction of oxygen, the metallic film having high adhesion to the silicon substrate and excellent barrier property to the silicon substrate can be obtained.

<Film Composition>

Four kinds of metallic films are formed by using a sputtering target containing 2.0 atomic % of Mg and changing the ratio of the partial pressure of the oxygen gas to that of the sputtering gas among 0.1%, 5.0%, 10.0% and 15.0%.

With respect to each metallic film formed, the contents of oxygen are measured by the XPS method (X-ray photoelectron spectroscopy)/respectively. Measuring results thereof are shown in the following Table 13.

TABLE 13

Content of oxygen atoms

| $O_2$ ratio | 0 [atomic %] |
|---|---|
| 0.1 | 0.1 |
| 5.0 | 6.4 |
| 10.0 | 7.5 |
| 15.0 | 9.3 |

It is confirmed from the above Table 13 that the higher the partial pressure of the oxygen gas at the time of sputtering, the greater is the amount of the oxygen atoms contained in the metallic film.

When the ratio of the partial pressure of the oxygen gas to that of the sputtering gas is at least 0.1%, the amount of the oxygen atoms contained in the metallic film is at least 0.1 atomic %.

As shown in Table 13, when the partial pressure of the oxygen gas is at least 0.1%, excellent results on the adhesion and the barrier property are obtained. Thus, it is seen that the metallic films containing at least 0.1 atomic % of oxygen have excellent adhesion and barrier property.

What is claimed is:

1. A wiring film forming method for forming a wiring film on a surface of an object to be film formed of which silicon or silicon dioxide is exposed, the wiring film forming method comprising the steps of:
introducing oxygen gas and a sputtering gas into a vacuum ambience in which the object to be film formed is disposed, wherein the oxygen gas is introduced such that a ratio of the partial pressure of the oxygen gas to the partial pressure of the sputtering gas in the vacuum ambience is at least 0.1% and at most 20.0%;

sputtering a first sputtering target in the vacuum ambience containing said introduced oxygen gas, the first sputtering target including copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy;

forming a first metallic film on a surface of the object to be film formed;

sputtering a second sputtering target comprising copper as a major component in a state in which the introduction of the oxygen gas into a vacuum ambience is stopped where the object to be film formed is disposed in the vacuum ambience;

forming a second metallic film on a surface of the first metallic film; and etching the first and second metallic films, and thereby forming the wiring film.

2. The wiring film forming method according to claim 1, wherein an identical target is used as the first and second sputtering targets, and the formation of the first metallic film and the formation of the second metallic film are performed inside the same vacuum chamber.

3. The wiring film forming method according to claim 1, wherein the second sputtering target is used as is a target including copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy, and wherein the first and second sputtering targets are arranged inside separate vacuum chambers, and the formations of the first and second metallic films are performed in the separate vacuum chambers.

4. The wiring film forming method according to claim 1, wherein a pure copper target is used as the second sputtering target, the first and second sputtering targets are arranged inside the same vacuum chamber, and the formation of the first metallic film and the formation of the second metallic film are performed in the vacuum chamber.

5. The wiring film forming method according to claim 1, wherein a pure copper target is used as the second sputtering target, the first and second sputtering targets are arranged inside separate vacuum chambers, and the formations of the first and second metallic films are performed inside the separate vacuum chambers.

6. The wiring film forming method according to claim 1, wherein a target containing at least 0.1 atomic % and at most 10.0 atomic % of Al is used as the first sputtering target.

7. The wiring film forming method according to claim 1, wherein a target containing at least 0.1 atomic % and at most 10.0 atomic % of Mg is used as the first sputtering target.

8. A wiring film forming method for forming a wiring film on a surface of an object to be film formed of which silicon or silicon dioxide is exposed, the wiring film forming method comprising the steps of:

introducing oxygen gas and a sputtering gas into a vacuum ambience in which the object to be film formed is disposed;

sputtering a first sputtering target in the vacuum ambience containing oxygen, the first sputtering target including copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy;

forming a first metallic film on a surface of the object to be film formed;

sputtering a second sputtering target comprising copper as a major component in a state in which the introduction of the oxygen gas into a vacuum ambience is stopped where the object to be film formed is disposed in the vacuum ambience;

forming a second metallic film on a surface of the first metallic film; and etching the first and second metallic films, and thereby forming the wiring film, wherein after the second metallic film is formed, introducing the oxygen gas and the sputtering gas into the vacuum ambience in which the object to be film formed is disposed;

sputtering a third sputtering target in the oxygen-containing vacuum ambience, the third sputtering target including copper as a major component and at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy in order to form a third metallic film on a surface of the second metallic film, and thereafter, etching the first to third metallic films.

9. The wiring film forming method according to claim 8, wherein the second sputtering target is used as a target containing at least one kind of additive elements selected from an additive element group consisting of Mg, Al, Si, Be, Ca, Sr, Ba, Ra, Sc, Y, La, Ce, Pr, Nd, Pm, Sm, Eu, Gd, Tb and Dy.

10. The wiring film forming method according to claim 9, wherein the first to third sputtering targets are arranged in separate vacuum chambers, and the formations of the first to third metallic films are performed in the separate vacuum chambers.

11. The wiring film forming method according to claim 9, wherein the first and third sputtering targets are arranged in the same vacuum chamber, and the formations of the first and third metallic films are performed in the same vacuum chamber, and wherein the second sputtering target is arranged in a vacuum chamber different from the vacuum chamber for the first and third sputtering targets, and the second metallic film is formed inside the different vacuum chamber.

12. The wiring film forming method according to claim 8, wherein a pure copper target is used as the second sputtering target.

13. The wiring film forming method according to claim 12, wherein the first to third sputtering targets are arranged inside separate vacuum chambers, and the first to third metallic films are formed inside the separate vacuum chambers.

14. The wiring film forming method according to claim 12, wherein the first and third sputtering targets are arranged inside the same vacuum chamber, and the first and third metallic films are formed in the same vacuum chamber, wherein the second sputtering target is arranged inside a vacuum chamber different from the vacuum chamber for the first and third sputtering target, and the second metallic film is formed in the different vacuum chamber.

* * * * *